US008080930B2

(12) United States Patent
King

(10) Patent No.: US 8,080,930 B2
(45) Date of Patent: Dec. 20, 2011

(54) SELF-REGENERATING NANOTIPS FOR LOW-POWER ELECTRIC PROPULSION (EP) CATHODES

(75) Inventor: Lyon Bradley King, Allouez, MI (US)

(73) Assignee: Michigan Technological University, Houghton, MI (US)

( * ) Notice: Subject to any disclaimer, the term of this patent is extended or adjusted under 35 U.S.C. 154(b) by 523 days.

(21) Appl. No.: 11/852,122

(22) Filed: Sep. 7, 2007

(65) Prior Publication Data

US 2009/0153015 A1 Jun. 18, 2009

Related U.S. Application Data

(60) Provisional application No. 60/824,857, filed on Sep. 7, 2006.

(51) Int. Cl.
*H01J 1/14* (2006.01)
*H01J 1/16* (2006.01)
*H01J 37/08* (2006.01)

(52) U.S. Cl. .................... 313/359.1; 313/309; 313/326; 313/351; 313/362.1; 313/336; 445/50; 445/51; 250/423 R

(58) Field of Classification Search .................. 313/336, 313/308, 310, 326, 359.1; 445/50, 46; 250/423 F, 250/423 R
See application file for complete search history.

(56) References Cited

U.S. PATENT DOCUMENTS 3,754,397 A 8/1973 Kidd et al.
3,763,346 A 10/1973 Drechsler et al.
3,789,471 A 2/1974 Spindt et al.
3,789,608 A 2/1974 Free
4,328,667 A * 5/1982 Valentian et al. ............... 60/202
4,721,878 A * 1/1988 Hagiwara et al. .......... 313/362.1
4,762,975 A 8/1988 Mahoney et al.
5,034,612 A * 7/1991 Ward et al. ................ 250/423 R
5,123,039 A 6/1992 Shoulders
5,194,739 A 3/1993 Sato et al.
5,697,827 A 12/1997 Rabinowitz
5,764,004 A 6/1998 Rabinowitz
5,967,873 A 10/1999 Rabinowitz
5,977,549 A * 11/1999 Wang et al. ............... 250/423 R
6,362,574 B1 3/2002 Aguero et al.
6,429,596 B1 8/2002 Jamison et al.
6,516,604 B2 2/2003 Mojarradi et al.
6,528,807 B1 3/2003 Koops et al.
6,531,811 B1 3/2003 Kudo et al.

(Continued)

OTHER PUBLICATIONS

Domonkos, M. T., "Evaluation of Low-Current Orificed Hollow Cathodes," Dept. of Aerospace Engineering, The University of Michigan, Ann Arbor, MI, 1999, pp. 1-155.

(Continued)

*Primary Examiner* — Sikha Roy
(74) *Attorney, Agent, or Firm* — Michael Best & Friedrich LLP

(57) ABSTRACT

Spindt-type field-emission cathodes for use in electric propulsion (EP) systems having self-assembling nanostructures that can repeatedly regenerate damaged cathode emitter nanotips. A nanotip is created by applying a negative potential near the surface of a liquefied base metal to create a Taylor cone converging to a nanotip, and solidifying the Taylor cone for use as a field-emission cathode. When the nanotip of the Taylor cone becomes sufficiently blunted or damaged to affect its utility, the base metal is re-liquefied by application of a heat source, a negative potential is reapplied to the surface of the base metal to recreate the Taylor cone, and a new nanotip is generated by solidifying the base metal.

10 Claims, 13 Drawing Sheets

U.S. PATENT DOCUMENTS

| | | | | |
|---|---|---|---|---|
| 6,607,415 | B2 | 8/2003 | Dunfield et al. | |
| 6,750,076 | B2 | 6/2004 | Corso | |
| 6,798,126 | B2 * | 9/2004 | Schwind et al. | 313/309 |
| 6,852,560 | B2 | 2/2005 | Corso | |
| 6,996,972 | B2 * | 2/2006 | Song | 60/202 |
| 7,059,111 | B2 | 6/2006 | King | |
| 7,129,513 | B2 | 10/2006 | Zhou et al. | |
| 7,175,802 | B2 | 2/2007 | Sandlin et al. | |
| 7,420,181 | B2 * | 9/2008 | Kaga et al. | 250/423 R |
| 7,696,489 | B2 * | 4/2010 | Pilz et al. | 250/423 R |
| 2005/0269559 | A1 | 12/2005 | Zhou et al. | |
| 2006/0076866 | A1 | 4/2006 | Terui et al. | |
| 2006/0202130 | A1 * | 9/2006 | Kollmer et al. | 250/423 R |

OTHER PUBLICATIONS

Fossum, E. C., Sommerville, J. D. and King, L. B., "Characterization of Near Field Plasma Environment of a Hollow Cathode Assembly," 40th AIAA/ASME/SAE/ASEE Joint Propulsion Conference, Paper No. AIAA-2004-3795, Ft. Lauderdale, FL, 2004, pp. 1-10.

Goebel, D. M., Watkins, R. M. and Jameson, K. K., "$LaB_6$ Hollow Cathodes for Ion and Hall Thrusters," 41st AIAA/ASME/SAE/ASEE Joint Propulsion Conference and Exhibit, *Journal of Propulsion and Power*, 23(3), May-Jun. 2007, pp. 552-558.

Sengupta, A., "Destructive Physical Analysis of Hollow Cathodes from the Deep Space 1 Flight Spare Ion Engine 30,000 Hr Life Test," 29th International Electric Propulsion Conference, Paper No. IEPC-2005-026, Princeton, NJ, Oct. 31-Nov. 4, 2005, pp. 1-17.

Patterson, M. J. and Oleson, S. R., "Low-Power Ion Propulsion for Small Spacecraft," 33rd AIAA/ASME/SAE/ASEE Joint Propulsion Conference and Exhibit, Paper No. AIAA-97/3060, Seattle, WA, 1997, pp. 1-13.

Khayms, V. and Martinez-Sanchez, M., "Preliminary Experimental Evaluation of a Miniaturized Hall Thruster," 25th International Electric Propulsion Conference, Paper No. IEPC-97-077, Cleveland, OH, 1997, pp. 483-489.

Marcuccio, S., Saviozzi, M., Rugo, F. and Andrenucci, M., "One Millinewton FEEP Thruster Tests," 1999 International Electric Propulsion Conference, Paper No. IEPC-99-069, 1999, pp. 443-447.

Gomer, R., "Field Emission and Field Ionization," Harvard University Press, 1961, pp. 1-195.

Marrese, C. M., "A Review of Field Emission Cathode Technologies for Electric Propulsion Systems and Instruments," IEEE Aerospace Conference Proceedings, 4, 2000, pp. 85-97.

Spindt, C. A., Holland, C. E., Schwoebel, P. R. and Brodie, I., "Field-Emitter-Array Development for Microwave Applications (II)," *Technical Digest of IVMC'97*, Kyongju, Korea, 1997, pp. 200-205.

Marrese, C.M., "Compatibility of Field Emission Cathode and Electric Propulsion Technologies," Dept. of Aerospace Engineering, The University of Michigan, Ann Arbor, MI, 1999, pp. 1-160.

Gasdaska, C. J., Falkos, P., Hruby, V., Robin, M., Demmons, N., McCormick, R., Spence, D. and Young, J., "Testing of Carbon Nanotube Field Emission Cathodes," 40th AIAA/ASME/SAE/ASEE Joint Propulsion Conference and Exhibit, Paper No. AIAA-2004-3427, Ft. Lauderdale, FL, 2004, pp. 1-7.

Gilchrist, B. E., Jensen, K. L., Gallimore, A. D. and Severns, J. G., "Space Based Applications for FEA Cathodes (FEAC)," Materials Research Society Symposium, vol. 621, 2000, pp. R4.8.1-R4.8.7.

Morris, D., Gilchrist, B., Gallimore, A. D. and Jensen, K., "Developing Field Emitter Array Cathode Systems for Electrodynamic Tether Propulsion," 36th AIAA/ASME/SAE/ASEE Joint Propulsion Conference and Exhibit, Paper No. AIAA-2000-3867, Huntsville, AL, 2000, pp. 1-11.

Marrese, C. M., Polk, J. E. and Mueller, J., "Field Emitter Cathodes and Electric Propulsion Systems," Materials Research Society Symposium, vol. 621, 2000, pp. R4.7.1-R.4.7.6.

Marrese-Reading, C. M. and Polk, J. E., "Spacecraft Propulsion Applications for Field Emission Cathodes," IEEE Vacuum Microelectronics Conference, 2001, pp. 123-124.

Kovaleski, S. D., "Ferroelectric Emission Cathodes for Low-Power Electric Propulsion," 38th AIAA/ASME/SAE/ASEE Joint Propulsion Conference and Exhibit, Paper No. AIAA-2002-4242, Indianapolis, IN, 2002, pp. 1-10.

Kent, B. J., Aplin, K. L., Wang, L., Huq, S. E., Stevens, R., Malik, A. and Nicolini, D., "A Field Effect Spacecraft Neutralizer for the LISA Pathfinder Mission," Classical and Quantum Gravity, 22, 2005, pp. S483-S486.

Driesel, W., Dietzsch, Ch. and Mühle, R., "In Situ Observation of the Tip Shape of AuGe Liquid Alloy Ion Sources Using a High Voltage Transmission Electron Microscope," *Journal of Vacuum Science and Technology B*, 14(5), 1996, pp. 3367-3380.

Fehringer, M., Rüdenauer, F. and Steiger, W., "Micronewton Indium Ion Thrusters," 1999 International Electric Propulsion Conference, Paper No. IEPC-99-072, Kitakyushu, Japan, 1999 pp. 1-6.

Nicolini, D., Chesta, E. and Gonzalez Del Amo, J., "Plume Characteristics of the Indium Needle Emitter (InFEEP)Thruster," 27th International Electric Propulsion Conference, Paper No. IEPC01-291, Pasadena, CA, 2001, pp. 1-6.

Suvorov, V. G. and Litvinov, E. A., "Dynamic Taylor Cone Formation on Liquid Metal Surface: Numerical Modelling," *Journal of Physics D: Applied Physics*, 33, 2000, pp. 1245-1251.

Swanson, L. W. and Schwind, G. A., "Electron Emission from a Liquid Metal," *Journal of Applied Physics*, 49(11), 1978, pp. 5655-5662.

Gomer, R., "On the Mechanism of Liquid Metal Electron and Ion Sources," *Applied Physics*, 19, 1979, pp. 365-375.

Rao, K. A., Bell, A. E., Schwind, G. A. and Swanson, L. W., "A Combination Electron/Ion Field Emission Source," *Journal of Vacuum Science and Technology B*, 7(6), 1989, pp. 1793-1797.

Hsieh, W.-P., and Wang, Y. L., "Prolonged Electron Emission as a Method to Fabricate a Stable and Bright Dual Ion/Electron Point Source," *Applied Physics Letters*, 87, 2005, pp. 194107-1 to 194107-2.

Mitterauer, J., "Pilot Experiments on Microstructured Liquid Metal Ion and Electron Sources," *Journal of Vacuum Science and Technology B*, 13(2), 1995, pp. 625-629.

Mitterauer, J., "Field Emission from Microstructured Cesiated Surfaces," *Journal of Vacuum Science and Technology B*, 14(3), 1996, pp. 2083-2086.

Sheu, B. L. and Wang, Y. L., "Emission Properties of a Dual Ion/Electron Source Based on Au-In Alloy," *Applied Physics Letters*, 80(8), 2002, pp. 1480-1482.

Knapp, W., Bischoff, L. and Teichert, J., "Formation of a Nano-Emitter for Electron Field Emission on a Liquid Metal Ion Source Tip after Solidification of the Alloy," *Vacuum*, 69, 2003, pp. 345-349.

Knapp, W., Bischoff, L. and Teichert, J., "Electron Emission Characteristics of Solidified Gold Alloy Liquid Metal Ion Sources," *Applied Surface Science*, 146, 1999, pp. 134-137.

Praprotnik, B., Driesel, W., Dietzsch, Ch. and Niedrig, H., "HV-TEM in-Situ Investigations of the Tip Shape of Indium Liquid Metal Ion Emitter," *Surface Science*, 314, 1994, pp. 353-364.

Saito, Y., Nakane, H. and Adachi, H., "Field Electron Emission from W Covered with In," *Journal of Vacuum Science and Technology B*, 18(2), 2000, pp. 1093-1096.

Chen, L. W. and Wang, Y. L., "Stable Field-Induced Electron Emission from a Solidified Liquid Metal Ion Source," *Applied Physics Letters*, 72(3), 1998, pp. 389-391.

Chen, L. W. and Wang, Y. L., "Operation of a Single Column Focused Ion/Electron Beam System Based on a Dual Ion/Electron Source," *Applied Physics Letters*, 73(15), 1998, pp. 2212-2214.

Hsieh, H.-P., Sheu, B. L. and Wang, Y. L., "Emission Properties of a Dual Ion/Electron Point Emitter Based on In-Bi Alloy," *Applied Physics Letters*, 83(11), 2003, pp. 2277-2279.

Tajmar, M., "Survey on FEEP Neutralizer Options," 38th AIAA/ASME/SAE/ASEE Joint Propulsion Conference and Exhibit, Paper No. AIAA-2002-4243, Indianapolis, IN, 2002, pp. 1-10.

Tajmar, M., "MEMS Indium FEEP Thruster: Manufacturing Study and First Prototype Results," 40th AIAA/ASME/SAE/ASEE Joint Propulsion Conference, Paper No. AIAA2004-3619, Fort Lauderdale, FL, 2004, pp. 1-9.

Hales, J. H. and Fleron, R. W., "Design and Development of MEMS Based Field Emission Electrical Propulsion System," 55th International Astronautical Congress, Paper No. IAC04-S.4.07, Vancouver, Canada, 2004, pp. 7081-7088.

Makela, J. M., King, L. B., Massey, D. R. and Fossum, E. C., "Development and Testing of a Prototype Bismuth Cathode for Hall Thrusters," 41st AIAA/ASME/SAE/ASEE Joint Propulsion Conference and Exhibit, Paper No. AIAA-2005-4236, Tucson, AZ, 2005, pp. 1-7.
Makela, J. M., Massey, D. R. and King, L. B., "Performance Characteristics of a $LaB_6$ Bismuth Cathode for Use with Hall Thrusters," 42nd AIAA/ASME/SAE/ASEE Joint Propulsion Conference and Exhibit, Paper No. AIAA-2006-4634, Sacramento, CA, 2006, pp. 1-7.
Massey, D. R., King, L. B. and Makela, J. M., "Progress on the Development of a Direct Evaporation Bismuth Hall Thruster," 41st AIAA/ASME/SAE/ASEE Joint Propulsion Conference and Exhibit, Paper No. AIAA-2005-4232, Tucson, AZ, 2005, pp. 1-8.
Melngailis, J., "Focused Ion Beam Technology and Applications," *Journal of Vacuum Science & Technology B*, 5(2) 1987, pp. 469-495.
Ekvall, I., Wahlström, E., Claesson, D., Olin, H. and Olsson, E., "Preparation and Characterization of Electrochemically Etched W Tips for STM," Measurement of Science and Technology 10 (1999) pp. 11-18.
Wallner, J. Z. and Bergstrom, P. L., "A Porous Silicon Based Particle Filter for Microsystems," *Physica Status Solidi* (*a*), 204(5), 2007, pp. 1469-1473.
Wallner, J. Z., Kunt, K. S., Obanionwu, H., Oborny, M.C., Bergstrom, P. L. and Zellers, E. T., "An Integrated Vapor Source with a Porous Silicon Wick," *Physica Status Solidi* (*a*), 204(5), 2007, p. 1449-1453.
Wallner, J. Z., Nagar, N., Friedrich, C. R. and Bergstrom, P. L., "Macro Porous Silicon as Pump Media for Electro-Osmotic Pumps," *Physica Staus. Solidi* (*a*), 204(5), 2007, pp. 1327-1331.
Zheng, J., Christophersen, M. and Bergstrom, P. L., "Thick Macroporous Membranes Made of P-Type Silicon," *Physica Status Solidi* (*a*), 202(8), 2005, pp. 1402-1406.
Zheng, J., Christophersen, M. and Bergstrom, P. L., "Formation Technique for Macroporous Morphology Superlattice," *Physica Status Solidi* (*a*), 202(8), 2005, pp. 1662-1667.

* cited by examiner

SELF-REGENERATING NANOTIPS FOR LOW-POWER ELECTRIC PROPULSION (EP) CATHODES

CROSS-REFERENCE TO RELATED APPLICATIONS

This application claims priority under 35 U.S.C. §119(e) to U.S. Provisional Patent Application No. 60/824,857 filed Sep. 7, 2006, the entire content of which is hereby incorporated by reference.

STATEMENT REGARDING FEDERALLY SPONSORED RESEARCH OR DEVELOPMENT

This invention was made with government support under FA9550-07-0053 awarded by the Air Force Office of Scientific Research. The government has certain rights in the invention.

BACKGROUND

Electron-emitting cathodes are employed on electric propulsion (EP) thrusters (1) to compensate for the emission of positive ions so that the vehicle remains electrically neutral, and (2) to sustain the discharge in plasma thrusters such as Hall and gridded ion engines. Traditionally, the technology used for electron emission has been the hollow cathode. Hollow cathodes are gas-fed devices, utilizing a small amount of propellant and onboard power to produce electron emission currents from a few Amps to a few tens of Amps. Reliable operation has been demonstrated for ~10,000 hours.

Typical hollow cathodes, as used in 1-kW-class Hall and ion thrusters, consume approximately 5-10% of the total thruster propellant and electrical power. Because the cathode itself generates no thrust, the consumption of propellant and power causes a direct 5-10% reduction in propulsion system efficiency and specific impulse. Although the ~10% performance impact of hollow cathodes is not negligible, it is tolerated for 1-kW-class devices because of the reliability of the technology. However, because hollow cathodes do not scale well to lower power, the associated efficiency losses become unacceptable as thruster size is reduced.

EP thrusters capable of operating efficiently at power levels less than 100 W can lead to the realization of fully functional micro- and nanosatellites. Research efforts toward this end include low-power ion thrusters, Hall thrusters, and Field-Emission Electric Propulsion (FEEP) systems. While some success has been achieved in scaling thruster technology to low power levels, the hollow cathode has shown itself not amenable to scaling. Thus, while a hollow cathode consuming ~50 W of electrical power and 0.5 mg/s of propellant is only a ~10% efficiency reduction for a 1-kW thruster system, the same cathode technology can easily represent an intolerable 50-100% efficiency reduction for EP systems using total power less than 100 W. Therefore, low-power EP systems would benefit from cathode technology that can produce sufficient electron emission while consuming little or no gas or electrical power.

In an effort to develop low-power EP systems compatible with micro- and nanosatellites, much research has focused in recent years on developing zero-flow, low-power "cold" cathodes based on the phenomenon of electron field emission. In field emission, electrons are extracted directly from a bulk solid material by an intense applied electric field at the solid-vacuum interface. The strength of the electric field must be sufficient to enable electron tunneling through the boundary potential via a process known as Fowler-Nordheim emission. Electric field strengths required for emission exceed $4\times10^{9}$ V/m.

The most promising field-emission technology appears to be the Spindt-type cathode. Spindt emitters rely on geometric enhancement of electric fields near sharp tips, where the field strength is inversely proportional to the tip radius. Microfabrication techniques have been used to demonstrate Mo and Si emitters with tip radii as small as 4 nm.

While Spindt-type field emitters have found widespread success in non-EP disciplines (e.g., flat panel video displays, microwave devices and electron microscopy systems), their application to the environments typical of EP thrusters has been somewhat less successful. In particular, it has proven very difficult to maintain the integrity of the fragile, nanometer-sized emitter tips in anything but ultra-high vacuum environments. When operated below $10^{-9}$ Torr, Spindt-type field emitters have demonstrated reliable operation and long life. However, when operated at elevated pressures ($10^{-5}$ Torr), the tip becomes blunt and/or contaminated and the ability to emit acceptable electron beam current is compromised. There are three main causes of tip degradation: (1) chemical contamination from oxygen or other reactive gases; (2) sputter erosion from ion impacts; and (3) destruction of the tip due to catastrophic arcing to nearby surfaces and/or electrodes.

Various approaches have been used in an attempt to circumvent the tip degradation mechanisms. Because most EP systems use inert gases as propellant, the potential for chemical contamination occurs mainly during ground testing. While this is still a significant obstacle, careful testing protocols can avoid tip contamination. Sputter erosion, however, is a more serious problem. The emitted electron current will readily ionize any residual gas in the vicinity of the tip. The resulting ions will be accelerated back towards the emitter causing unavoidable sputter erosion of the tip. This effect is exacerbated in the environment of an EP thruster, where significant quantities of ambient plasma ions produced within and around the thruster will amplify tip erosion. Carefully designed multi-layer, multi-electrode extractor/gate/accelerator structures have been developed to shield emitter arrays from sputtering. Such electrode geometries have demonstrated a significant improvement in emitter lifetime, however sputter erosion arising from ions produced within the multi-electrode structure remains an issue. Attempts to reduce applied electrode voltages below the tip sputter threshold are accompanied by reduced emission. The issue of catastrophic arcing has been addressed by fabrication techniques that incorporate current-limiting features in the substrate. While such current-limiting architectures have proven effective for a range of operating conditions, arc failures are unavoidable in significantly high-pressure environments.

None of the currently proposed methods are capable of eliminating cathode failure as the result of tip degradation. The most accepted approach to reducing the risk of cathode failure has been the proposition of massively parallel arrays of closely packed emitter tips. Emitter lifetime is factored in to the number of tips required, and destroyed or degraded tips are replaced by available spares. Of course, this approach has geometric and practical constraints. Therefore, low-power EP systems would benefit from cathode technology that overcomes the problems associate with tip degradation.

SUMMARY

In one embodiment, the invention provides an apparatus comprising an electric propulsion thruster, a field-emission cathode comprising a base metal, an electrode downstream from the field-emission cathode, and a heat source in contact with the field-emission cathode.

In another embodiment, the invention provides a method for developing field-emission cathodes for use in electronic propulsion systems, the method comprising delivering a base metal to an extraction site, applying a negative bias to an electrode downstream from the extraction site to create a Taylor cone having a cone tip in the base metal at the extraction site, solidifying the base metal to preserve the Taylor cone, applying a positive bias to the electrode so that the Taylor cone functions as a field-emission cathode, regenerating the cone tip after it has become damaged by re-liquefying the base metal, applying a negative bias to the electrode to regenerate the Taylor cone tip, and re-solidifying the base metal to preserve the cone tip, wherein the field-emission cathode is used in an electric propulsion system.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the term "conduit" is used broadly to represent a pathway, and is not meant to be restricted to any particular physical or mechanical device.

It also is understood that any numerical range recited herein includes all values from the lower value to the upper value. For example, if a range is stated as 1 μm to 50 μm, it is intended that values such as 2 μm to 4 μm, 10 μm to 30 μm, or 1 μm to 3 μm, etc., are expressly enumerated in this specification. These are only examples of what is specifically intended, and all possible combinations of numerical values between and including the lowest value and the highest value enumerated are to be considered to be expressly stated in this application.

Figure 1:
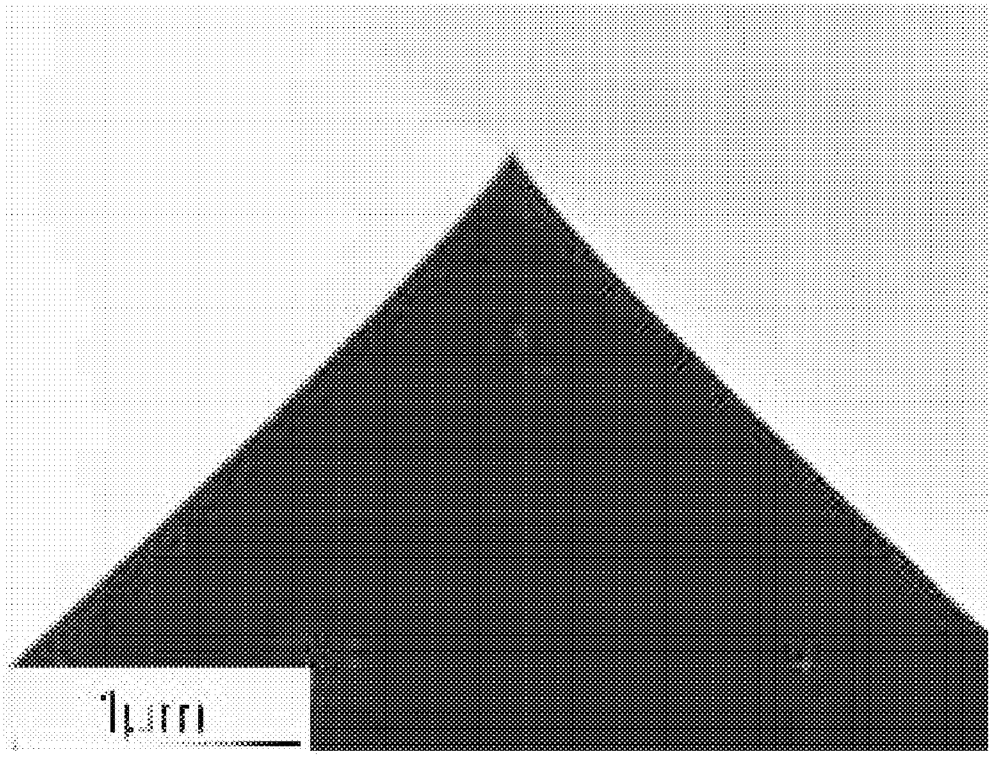
FIG. 1 is a Tunneling Electron Microscopy (TEM) image of a Taylor cone formed in a gold-germanium alloy during ion emission. The tip radius is less than 20 nm.

The present invention relates to Spindt-type field-emission cathodes for use in EP having self-assembling nanostructures that can repeatedly regenerate damaged cathode emitter nanotips. The nanotip of the field-emission cathode is first created by drawing a liquefied base metal, that has been heated above its melting point, into a Taylor cone using a negatively biased electrode just downstream from the surface of the liquefied base metal. The liquefied base metal is then solidified, or quenched, into the shape of the Taylor cone, as illustrated in FIG. 1, by reducing or eliminating the heat source to permit the base metal temperature to drop below the melting temperature. The Taylor cone has a tip radius on the order of nanometers. After the Taylor cone nanotip has solidified, the electrode is positively biased to create a cold electron emitter (i.e. field-emission cathode). When the nanotip becomes sufficiently blunted or damaged to affect its utility, the base metal is re-liquefied by application of the heat source, the electrode is negatively biased to regenerate the Taylor cone nanotip, and the nanotip is preserved by re-solidifying the base metal.

The apparatus for nanotip regeneration may include (1) a reservoir containing a base metal having a low melting point, (2) a heating/cooling mechanism for melting/quenching the base metal, (3) a supply mechanism to deliver the base metal to the tip formation site, (4) an extraction site for forming a liquid-metal Taylor cone (e.g., either a capillary or a needle), (5) at least one extraction electrode, and (6) an electrical power supply capable of positive and negative polarity.

Figure 2:
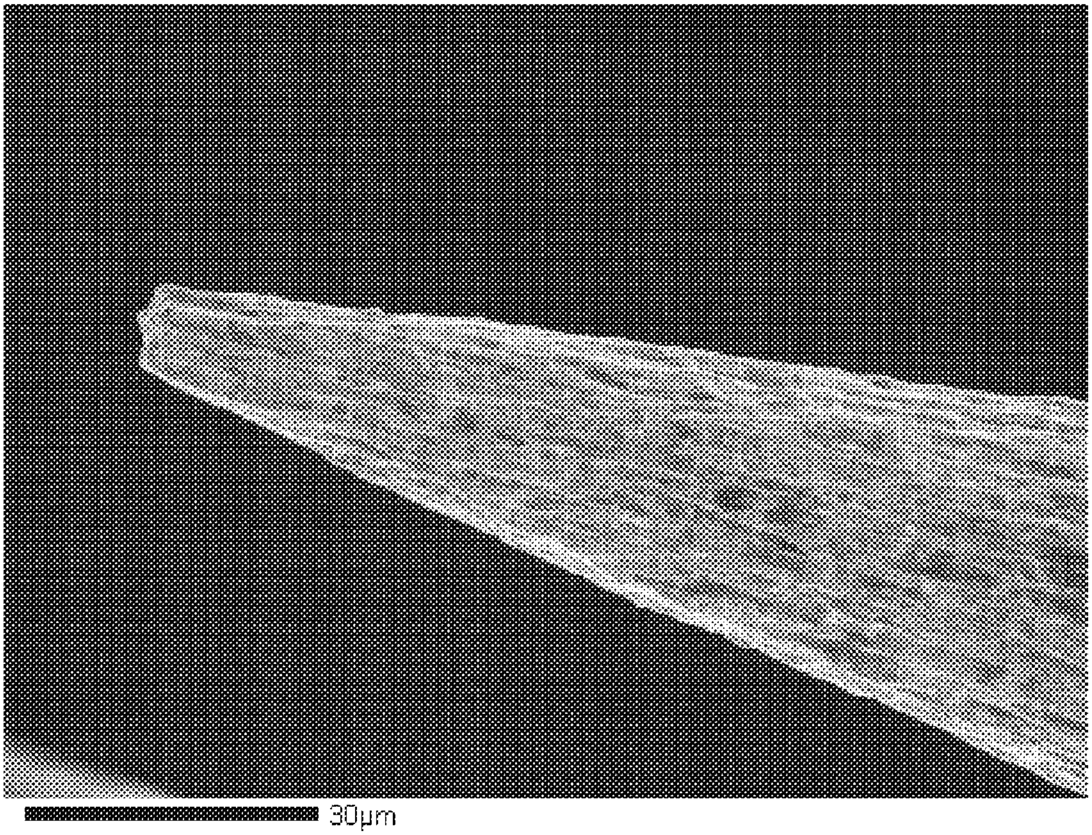
FIG. 2 is a Scanning Electron Microscopy (SEM) image of an electrochemically etched tungsten wire.
Figure 3:
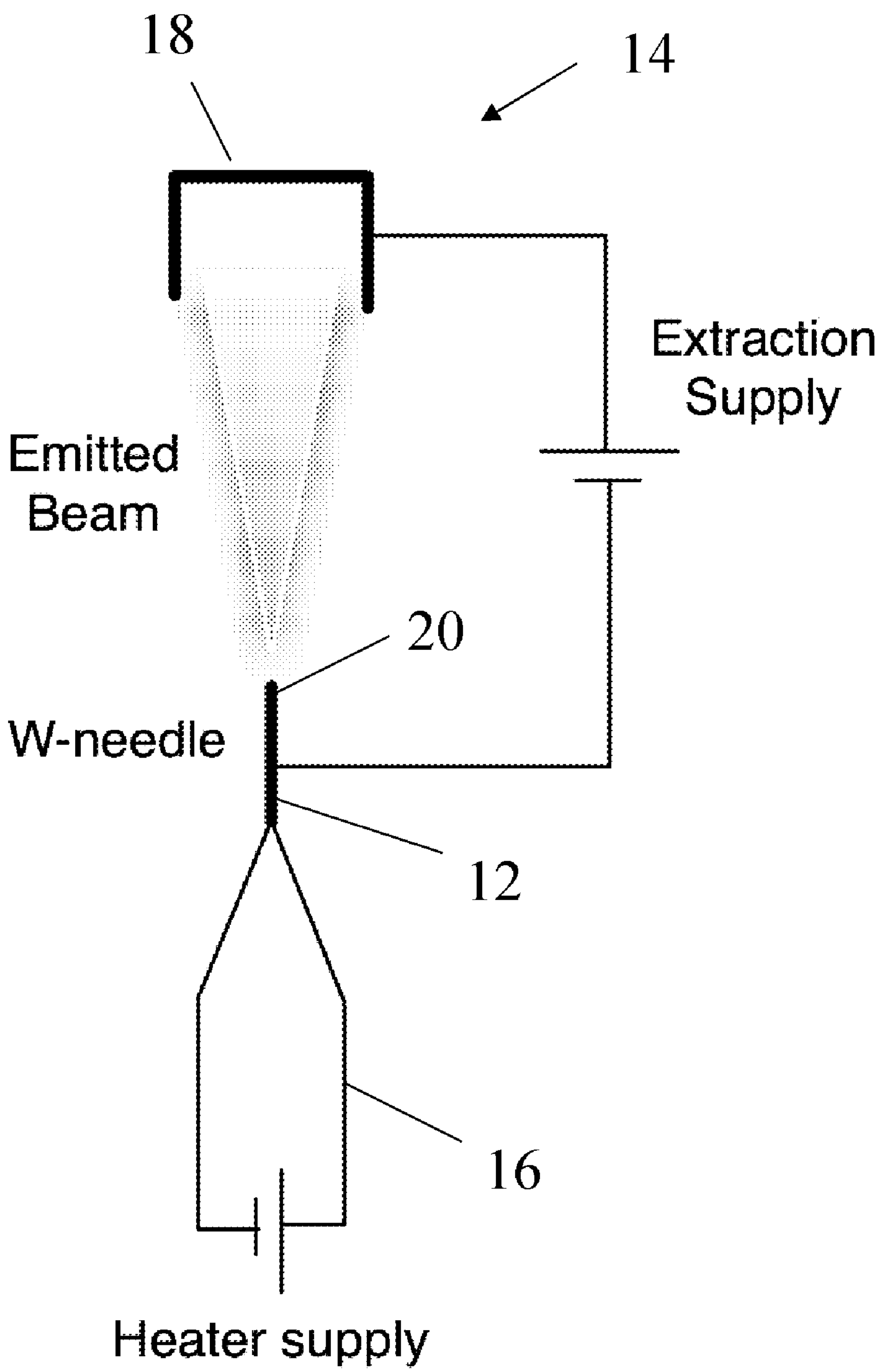
FIG. 3 is a schematic diagram of a single needle emitter electrode.

In some embodiments, the field-emission cathodes are single-needle emitters as illustrated in FIGS. 2 and 3. The tip of a needle serves as an extraction site upon which a Taylor cone tip can be formed and regenerated. Sharp needles may be created by electrochemically etching a metal wire to produce a sharp tip. The wire may be fabricated from a variety of metals or metal alloys having melting points higher than those of the base metals used to wet the tip. FIG. 2 shows a tungsten wire that has been sharpened by electrochemical etching in a 2 M NaOH solution. Suitably sharp needles may have tip diameters ranging from about 10 nm to about 10 μm.

A base metal is applied to the sharpened needle tip by, for example, dipping a heated needle into a crucible containing liquefied base metal or relying on capillary forces to draw the base metal to the needle from some reservoir. Base metals typically have low melting points that range from about 10° C. to about 300° C. at atmospheric pressure. Exemplary base metals may include indium, gallium, gold, germanium, bismuth, and alloys that may contain one of these elements.

As illustrated in FIG. 3, the etched and coated needle 12 is then inserted into a fixture 14 that serves as both a heater and liquefied base metal reservoir. An electrical circuit 16 provides resistive heating to the needle 12. Other sources of heat known to those skilled in the art may be used in place of, or in addition to, resistive heating. An electrode 18 is located about 0.1 to about 3 mm downstream from the tip 20 of the needle.

The polarity of the electrode 18 may be positive or negative, depending upon whether the needle 12 is operating as an electron emitter or an ion emitter, respectively.

Figure 4:
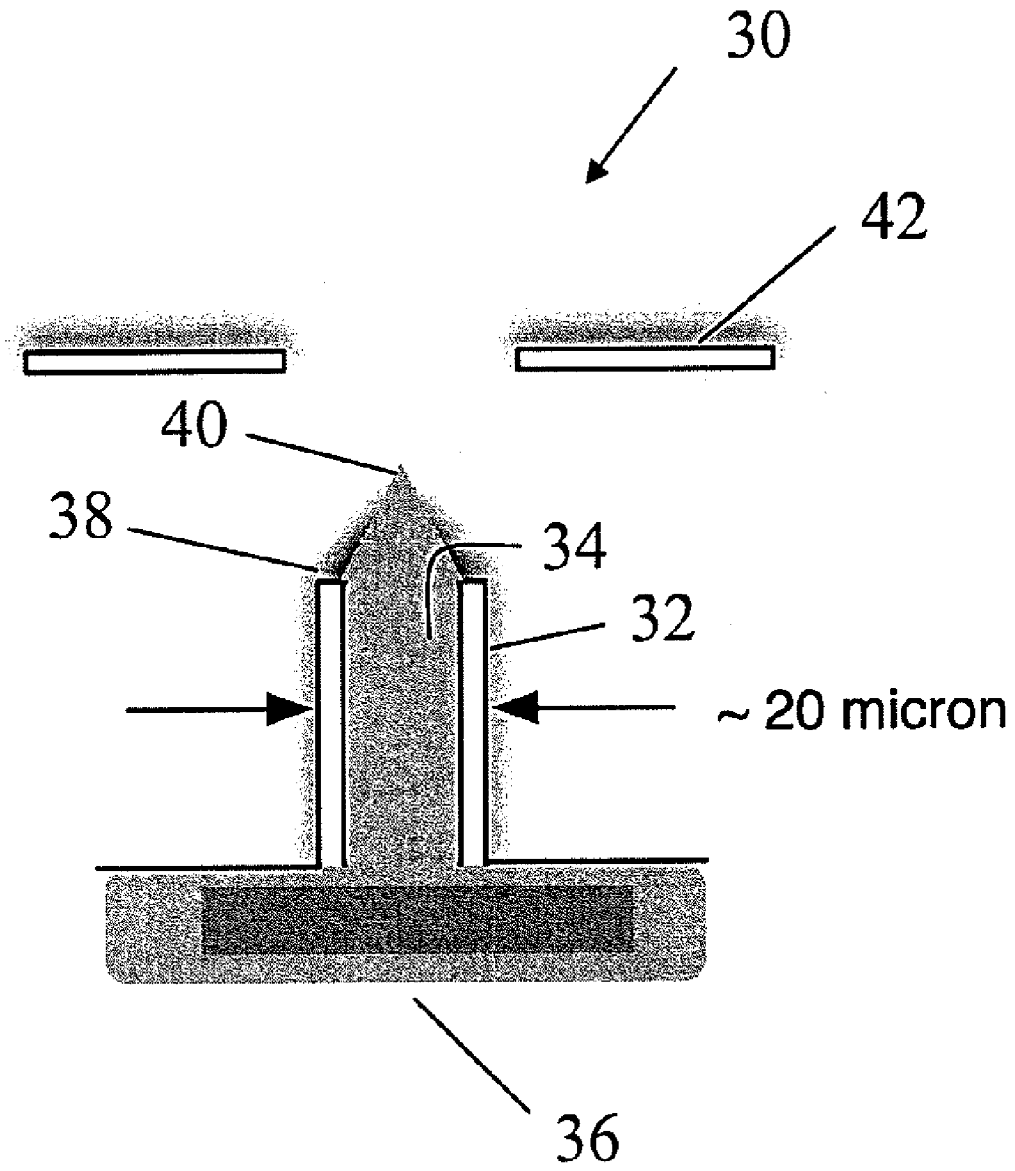
FIG. 4 is a schematic diagram of a micro-capillary emitter electrode.

In other embodiments, the field-emission cathodes are micro-capillary devices that deliver liquefied base metal to a cone formation site, or extraction site, for generation of the Taylor cone. An example of a micro-capillary device 30 is illustrated in FIG. 4. The micro-capillary device 30 comprises a substrate 32 through which a micro-capillary sized pore 34 extends. When the substrate 32 is placed in contact with a base metal reservoir 36, surface tension forces wick the liquefied base metal up the walls of the pore 34 and deliver the base metal to a pore exit 38. A Taylor cone 40 is formed from the base metal at the pore exit 38. The micro-capillary pore 34 may be fabricated by any mechanism known to those skilled in the art, including microhole drilling, laser drilling, Si MEMS fabrication, and electric discharge machining. The diameter of the pore 34 may be about 0.8 μm to about 50 μm. In some examples, the diameter of the pore 34 is about 20 μm to about 50 μm. This includes examples where the diameter of the pore 34 is about 20 μm. The depth of the pore 34 may be at least about 600 μm.

The substrate 32 may be made from any metal that creates sufficient surface tension to wick the liquefied base metal up into the micro-capillary sized pore 34. Base metals include those mentioned above with respect to the single needle emitter. Silicon substrates containing a metallic pore lining may also be used. Silicon by itself is not a good substrate because base metals typically do not wet silicon. However, a metallic capillary lining can be applied to the silicon substrate by, for example, electroplating, sputter deposition, or electron-beam evaporation to produce a substrate having good wicking properties for indium and other base metal candidates. Suitable lining metals for a silicon substrate may include tungsten, aluminum, gold, molybdenum, nickel, copper, titanium and combinations thereof.

Figure 5:
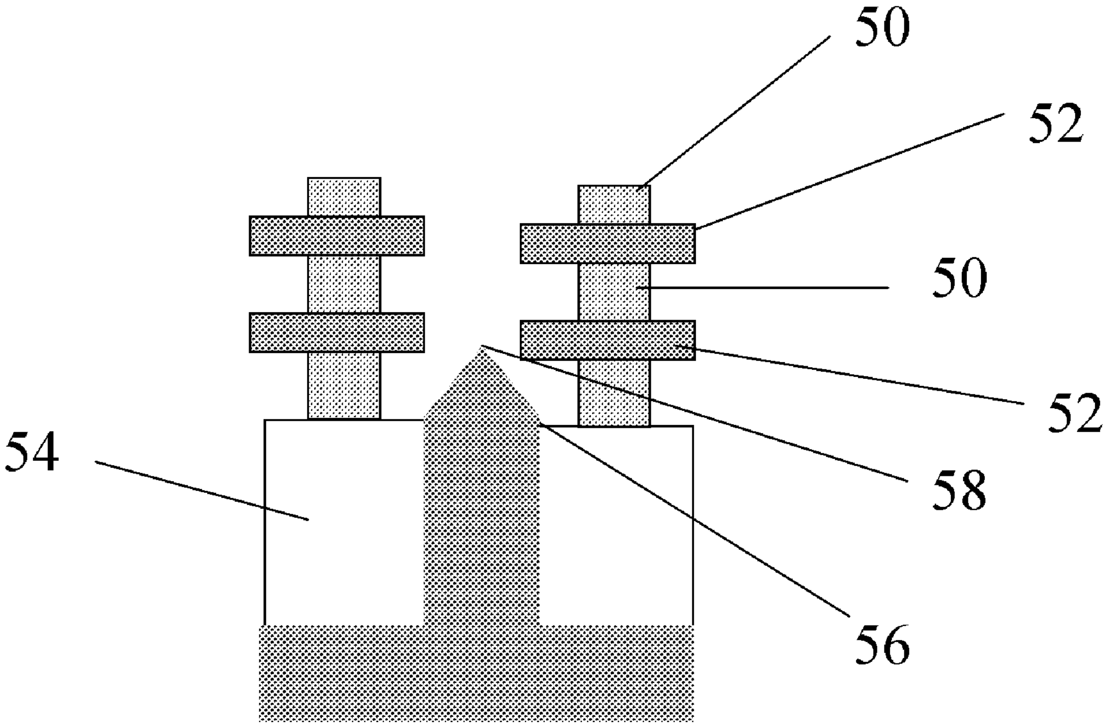
FIG. 5 is an alternative micro-capillary emitter electrode.

An electrode 42 is located about 0.1 to about 3 mm downstream from the pore exit 38. The polarity of the electrode 42 may be positive or negative, depending upon whether the micro-capillary device 30 is operating as an electron emitter or an ion emitter, respectively. As illustrated in FIG. 4, the electrode 42 may displaced from the substrate 32. In other instances, the electrode may be integrated into the substrate. FIG. 5 illustrates, for example, a multi-layer multi-electrode extractor/gate/accelerator structure that may be used to enhance electron emission away from the Taylor cone. Such structure has multiple stacked insulators 50 and electrodes 52. The electrodes 52 should be sufficiently downstream from the pore exit 56 to generate a Taylor cone 58.

A single field-emission cathode is illustrated in each of the above embodiments. However, it should be understood that two or more field-emission cathodes may be employed in a given application. For example, in some EP applications, an array of field-emission cathodes may be employed. This includes examples where the array comprises two or more single needle electrodes. This also includes examples where a micro-capillary device comprises a substrate having two or more micro-capillary pores.

Figure 6:
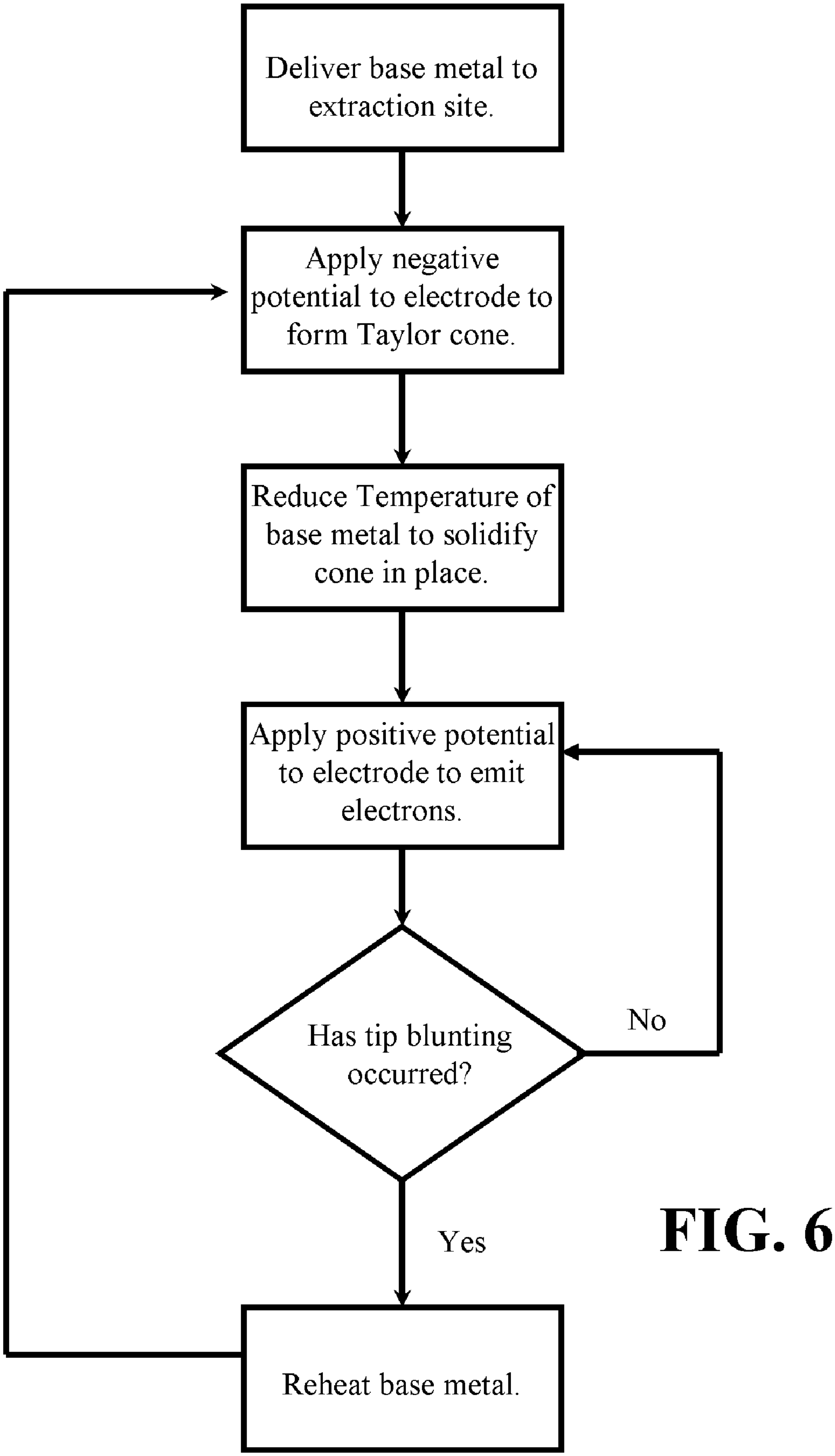
FIG. 6 is a flow chart summarizing one embodiment for re-generating damaged nanotips on a field-emission cathode.
Figure 7:
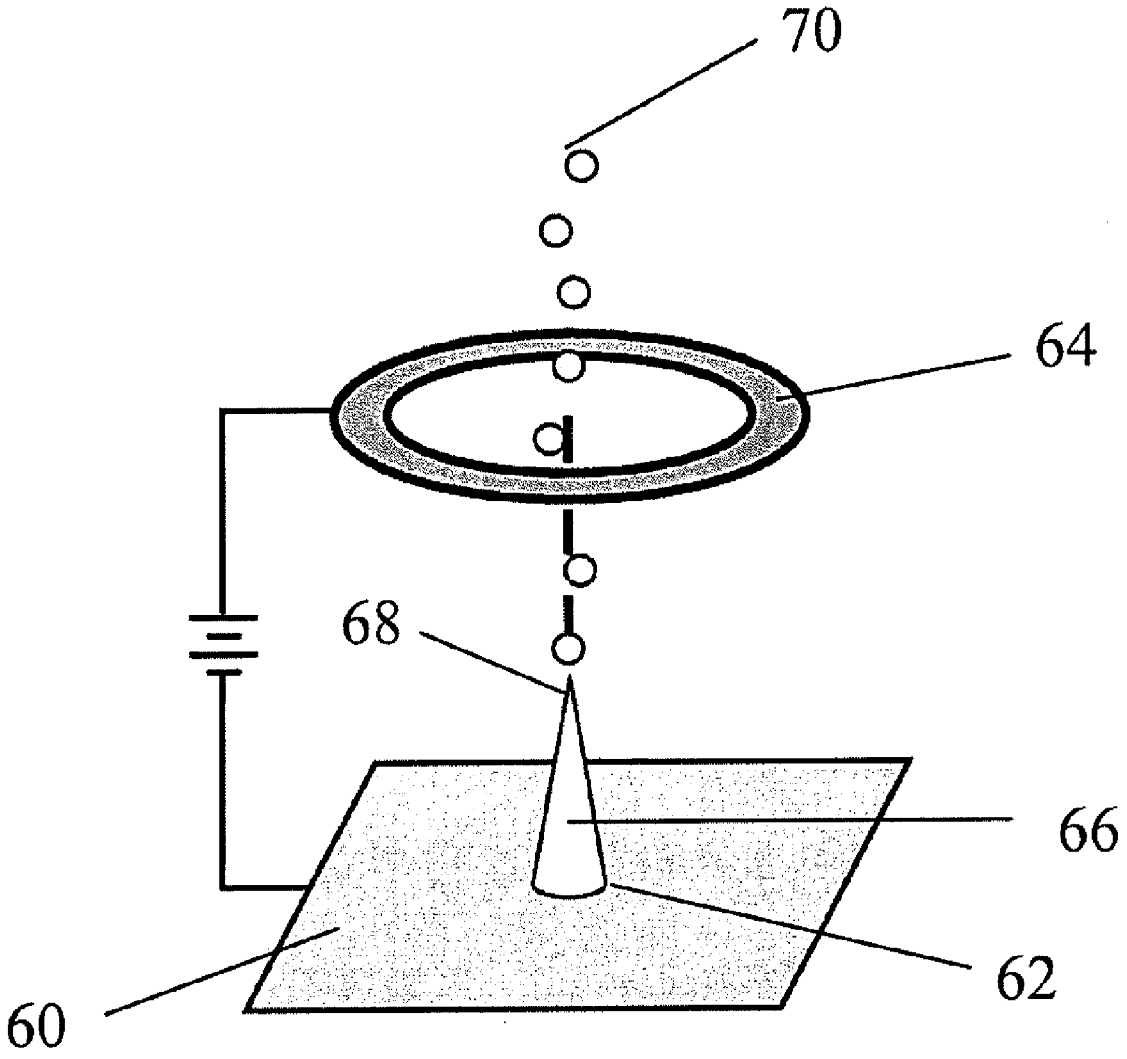
FIG. 7 is a schematic diagram of a field-emission cathode.

Although Taylor cones may be formed at a variety of extraction sites, for example the tip of a needle or at the open end of a micro-capillary pore as described above, the method by which the Taylor cones are formed and the process by which they may be regenerated are similar. As summarized in FIG. 6 and exemplified in FIG. 7, liquefied base metal 60 is delivered to the extraction site 62, for example, by application to the tip of a needle or by being drawn into a micro-capillary pore. An intense electric field is created by a negatively biased electrode 64 located near the surface of the liquefied base metal 60. A balance between the surface tension of the liquefied base metal 60 and the electrostatic forces created by the electrode 64 causes a Taylor cone 66 to form at the surface of the liquefied base metal 60. Because the Taylor cone 66 has a very sharp tip 68, geometric enhancement of the local electric field at the cone tip is sufficient to extract metal ions 70 directly from the liquefied base metal 60. The ions 70 emerge from a very narrow (few nanometer diameter) liquid jet at the cone tip 68. This same principle is applied to liquid-metal-ion-sources (LMIS) used in FEEP thrusters for space vehicles.

Figure 8A:
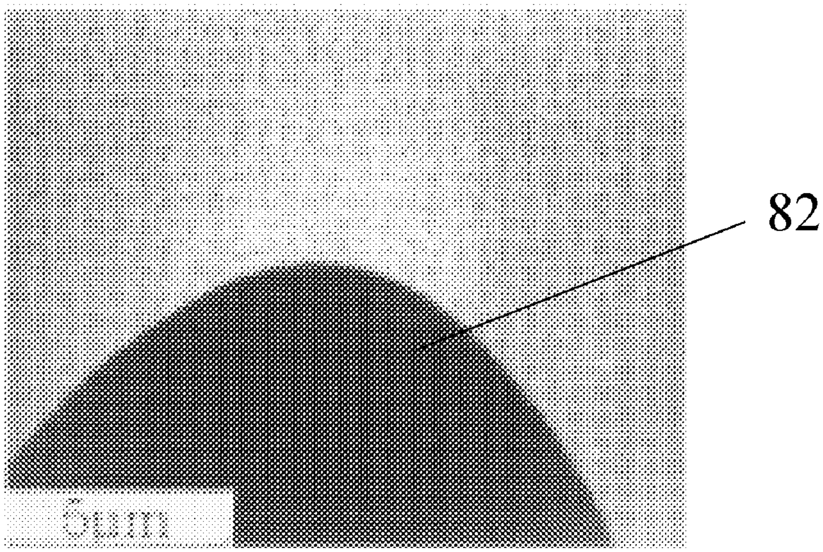
FIG. 8*a* is an image of the tip of an etched tungsten needle before Taylor cone formation.
Figure 8B:
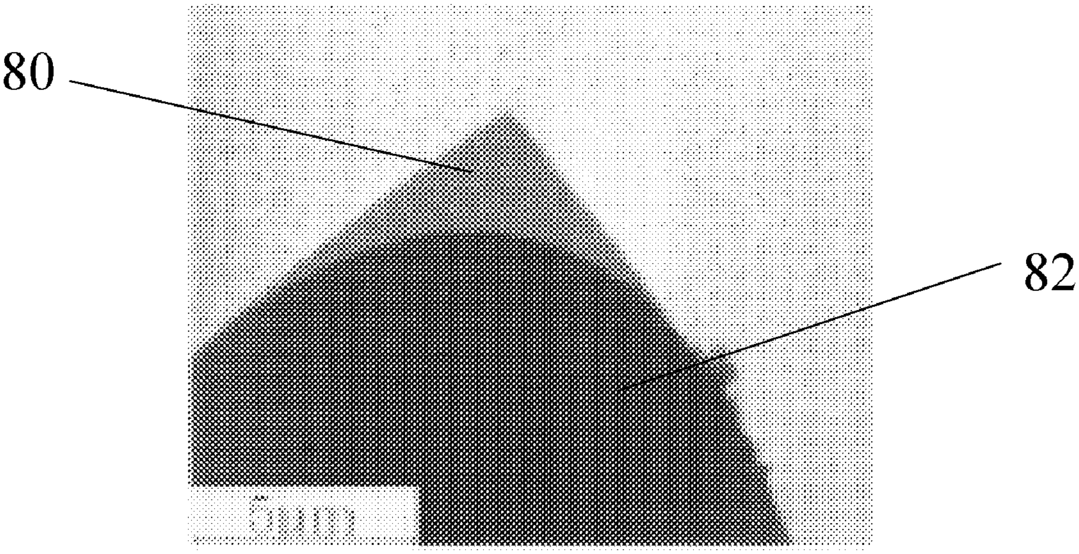
FIG. 8*b* is an image of the tip of an etched tungsten needle after Taylor cone formation.

Once the Taylor cone 66 has formed, the liquid base metal 60 is solidified, or quenched, while subjected to the electric field to preserve the sharp Taylor cone tip 68 for use as a field-emission cathode for EP. FIG. 8 illustrates the formation of a Taylor cone 80 on a single needle 82, where (a) shows the needle 82 prior to the addition of base metal, and (b) shows the formation of a Taylor cone on the tip of the needle 82. The resulting Taylor cone 66 will have a tip radius of about 5 to about 200 nanometers, which is ideal for Fowler-Nordheim emission. By reversing the polarity of the extraction electrode 64, the solid-metal tip 68 will function as a field-emission cathode (i.e., cold electron emitter). As electron discharge is continued for long durations, the emitter tip 68 begins to wear and blunt and the local electric field decreases. This circumstance is unfavorable and eventually renders the emitter tip 68 useless as an electron source. In the event the tip integrity is compromised, the tip 68 can be regenerated by re-liquefying the base metal 60, applying a negative bias to the extraction electrode 64 to produce a new Taylor cone 66, and solidifying the Taylor cone 66 to preserve the sharp cone tip 68 for use as a field-emission cathode. The number of times that a device can be regenerated will be limited only by the reserve supply of base metal. Lifetimes could, conceivably, be many 10's of thousands of hours. The procedure is the equivalent of having a MEMS fabrication and repair lab on-board a spacecraft.

The voltage applied to the electrode during quenching of the base metal typically ranges from 10 V to about 10 kV, depending on the spacing between the extraction site and the electrode. Ion emission currents during quenching typically range from about 0.5 μA to about 50 μA. As demonstrated in Example 1, quenching at higher emission currents can produce larger electron emission at lower extraction voltages than when quenched at lower emission currents, implying that the emitter tip radius is reduced when quenching occurs at higher ion emission currents.

The regenerative field emission cathodes of the present invention can be used in all space-base applications where field-emission cathodes are currently candidates. This includes discharge cathodes and neutralizers in low- to medium-power EP thrusters, as current return electrodes for electrodynamic space tethers, or for spacecraft neutralization on space science missions.

The quenched liquid-metal ion source/electron emitter technology proposed here may also enable a new genre of dual-mode macro/micro propulsion EP systems. For instance, a large array of the proposed emitters could conceivably provide enough current to serve as a cathode for a medium-powered Hall or ion thruster. Since the process of tip regeneration essentially consists of operating the arrays as FEEP thrusters, the same hardware and propellant that serves as a cathode to the macro-EP thruster can provide high-Isp and high-efficiency micropropulsion capability for fine maneuvering of the vehicle. Thus, a single propulsion system could be used to, say, rendezvous with a target spacecraft then maintain a close proximity to that target for space situational awareness or other formation-flying applications.

EXAMPLES

Example 1

Single Needle Field-Emission Cathode

Experimental approach. Sharp tungsten needles were formed by electrochemically etching tungsten wires in a 2M NaOH solution. A 0.010" diameter tungsten wire is immersed into a 2M NaOH solution and electrically biased with respect to a separate electrode also immersed in the solution. A three-step process was performed. First, the wire was immersed about one inch into the solution and biased 20 V with respect to the electrode using a DC power supply such that about 1.5 Amps of current flowed in the circuit. After approximately one minute the wire dissolved at the liquid-air interface. Second, the wire was immersed 2 mm into the solution and biased again at 20 volts, 1.5 Amps. Third, the wire was immersed 0.5" into the same NaOH solution and an AC bias of 5 V peak-to-peak was applied at a frequency of 60 Hz for 5 minutes.

Using this etching technique it was possible to obtain reproducible tip diameters ranging from the 100's of nanometers range up to a few microns, depending on the etch conditions.

Figure 9:
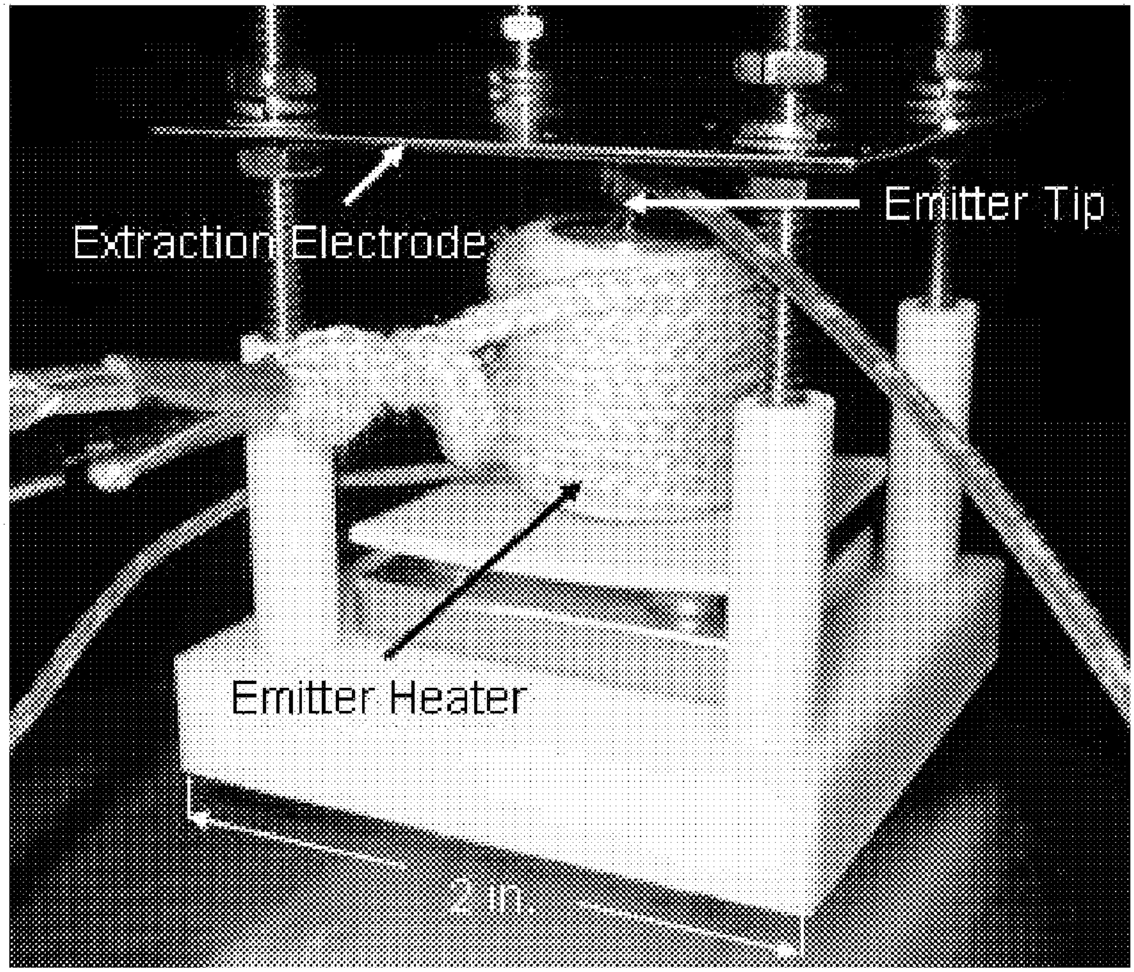
FIG. 9 is a field-emission cathode fixture employed in Example 1.

The sharpened tungsten tips were then coated with indium by dipping the heated wire in a liquid crucible of indium. The etched and coated tips were then inserted into the fixture illustrated in FIG. 9 that served as both a heater as well as an indium reservoir. A planar stainless-steel extraction electrode was positioned downstream of the tip. Typical gap spacing between emitter tip and extraction electrode was 1.0 to 1.5 mm.

Figure 10A:
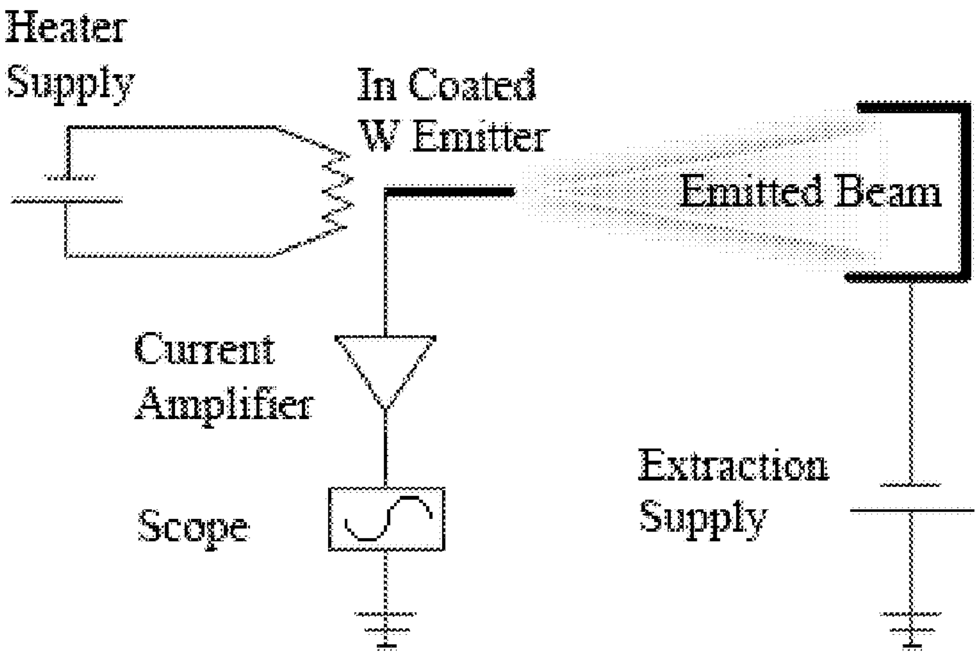
FIG. 10*a* is a schematic of a single needle emitter during regeneration of a damaged Taylor cone tip.
Figure 10B:
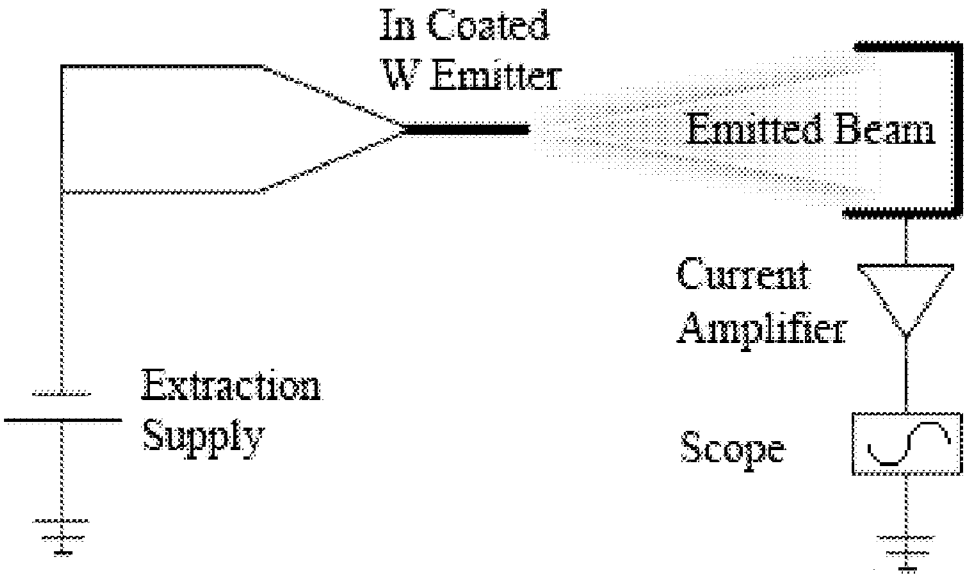
FIG. 10*b* is a schematic of a singe needle emitter operating as a field-emission cathode.

To operate the tip as an ion emitter, the emitter heater was used to maintain the indium metal reservoir above the melting temperature of indium, which is 156.6° C. To create the field-emission cathode, the emitter heater was un-powered, solidifying the indium metal in the reservoir as well as on the emitter tip. The experimental setup for ion and electron emission is illustrated in FIGS. 10*a* and 10*b*, respectively. A current amplifier with gain of $10^5$ V/A was used to amplify the discharge signal so that the discharge current could be easily recorded on an oscilloscope.

All of the testing reported here was performed in a UHV chamber at Michigan Technological University's Yoke Khin Yap Research Lab. Research was performed in a 24"-diameter by 8"-deep vacuum chamber. The tank was evacuated using a single turbo-molecular pump and backed by a mechanical pump. Vacuum pressure of $10^{-7}$ Torr could be achieved in approximately 24 hours.

Figure 11:
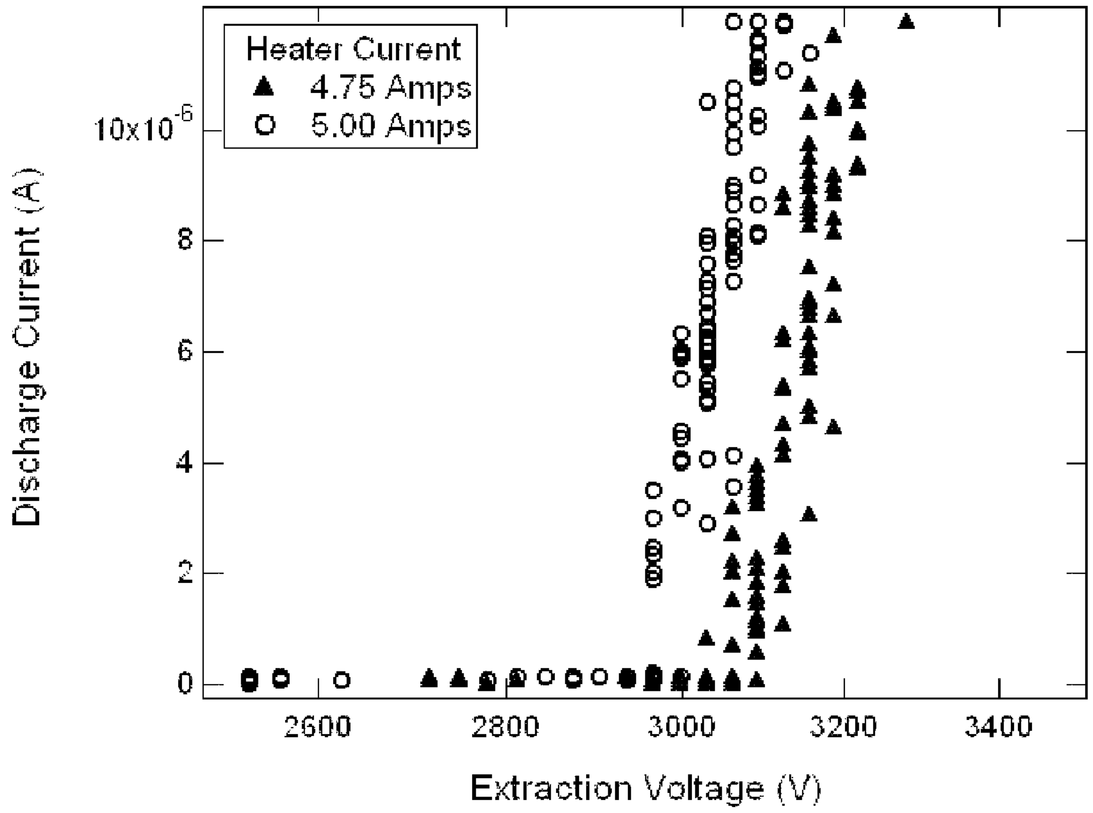
FIG. 11 is a plot of ion emission current versus extraction voltage at two heater currents.
Figure 12:
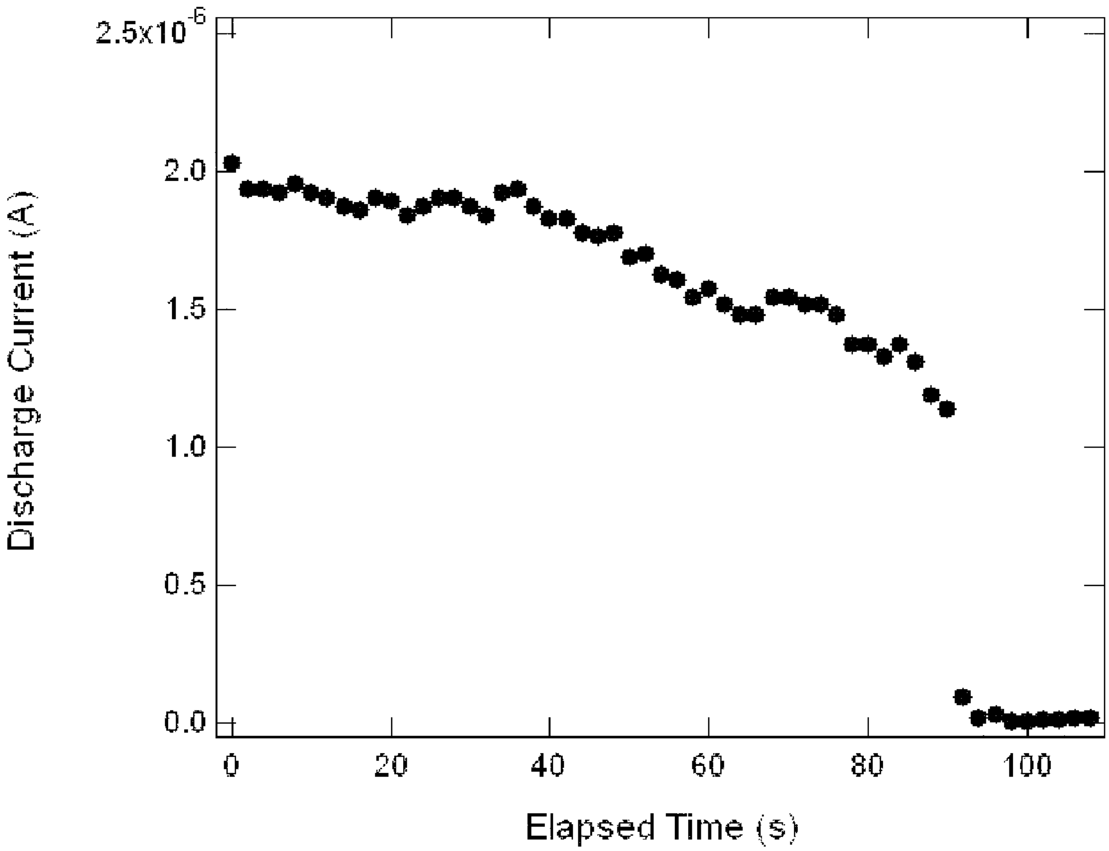
FIG. 12 is a typical quenching curve for Taylor cone formation from a 2 μA discharge after the emitter heater has been disabled at time t=0.

Results. To achieve ion emission, the emitter heating supply was enabled and increased to attain a suitable temperature for the indium to melt. The heater current was held constant for 45 minutes to allow the fixture to reach thermal equilibrium prior to attempting ion emission. The extraction electrode was then biased with a negative voltage and the emitter was grounded to obtain ion emission. Once ion emission was achieved and stabilized (which sometimes took up to several minutes), discharge I-V characteristics were taken at various emitter heating currents, as shown in FIG. 11. To solidify the Taylor cone, the emission was quenched by turning off the heater. Quenching occurred over 90 seconds when the emission was 2 μA and approximately 200 seconds when emission was 25 μA. A characteristic quenching curve is presented in FIG. 12.

Figure 13:
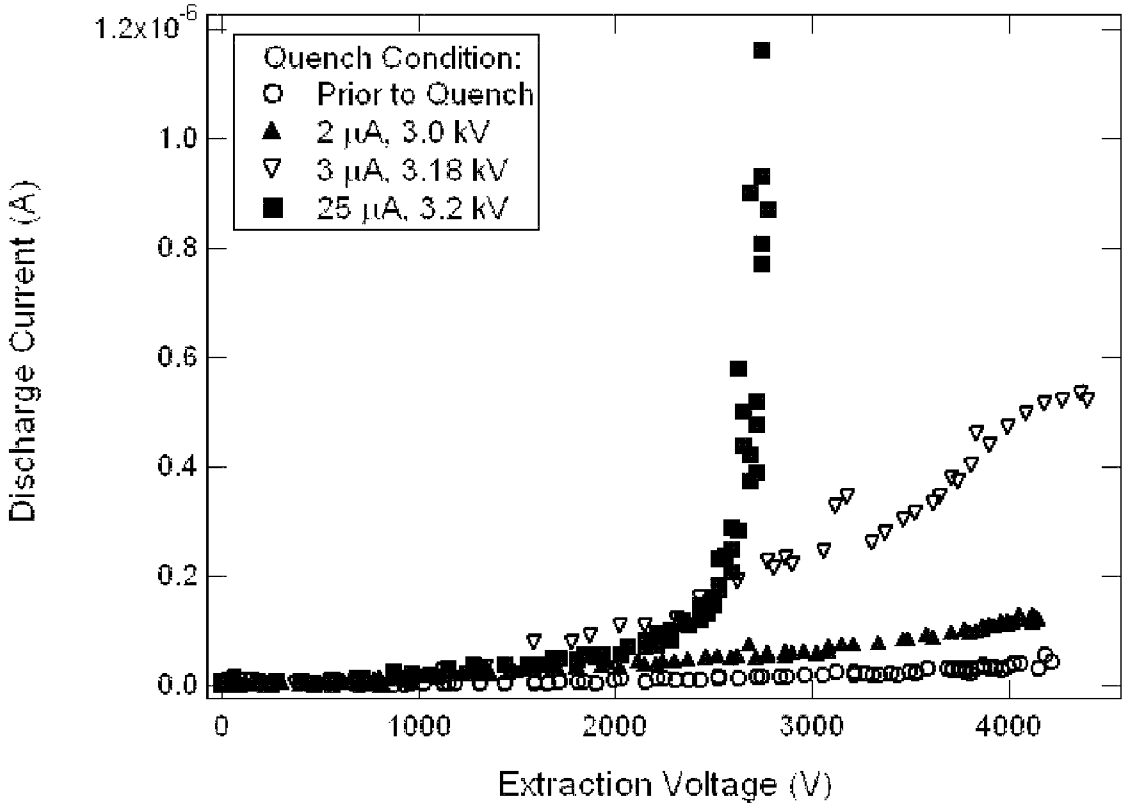
FIG. 13 illustrates electron I-V characteristics prior to quenching a Taylor cone, quenching at 2 μA, 3 μA and quenching at 25 μA.

The Taylor cones were quenched at three different discharge currents and then used to obtain electron I-V characteristics. As shown in FIG. 13, the most electron emission that was achieved was from the emitter tip that had been quenched at 25 μA. The next greatest emission was from the emitter tip quenched at 3 μA, and the least amount of electron discharge current was from an emitter tip quenched at 2 μA. It should be noted that while quenching the emitter tip at 3 μA, the emission current was unstable and may account for the irregular trace in FIG. 13. It is unknown whether the ion emission ceased because the cone solidified or if some other mechanism was responsible, such that the indium solidified under a much lower emission current.

The electron emission characteristics from the quenched ion sources are compared in FIG. 13 with an electron I-V curve that was obtained from the needle before any ion emission/Taylor cone formation was performed. This was done so that a baseline could be established for electron I-V characteristics with the as-etched needle for comparison with the quenched Taylor cone configurations. It is clear from FIG. 13 that the quenching process greatly enhanced the electron field emission when compared to the blunt as-etched needle behavior.

Discussion. It was found that by operating an indium field emitter as a liquid-ion-metal source (LMIS) and quenching the tip to form a Taylor cone by removing the emitter heat while leaving the extraction electrode at a constant voltage it was possible to obtain an increase in electron discharge. The data show that quenching at as low as 2 μA produced an increase in electron discharge current as compared with the unquenched emitter. When the current at quench was increased to 3 and 25 μA, the discharge that was measured increased greatly. A trend can be noticed that quenching at higher ion emission currents yields increased electron emission at lower extraction voltages.

Using the electron I-V curves along with the Fowler-Nordheim equation, a theoretical estimate of the emitter tip radius can be made. For tip radius evaluation, Gomer's technique of applying the following Fowler-Nordheim equation was used, $$\frac{I}{V^2} = a\exp\left(\frac{-b'\phi^2}{V}\right), \qquad \text{Equation [1]}$$

where a and b' are introduced as the following, $$a = A\cdot 6.2\times10^{-6}(\mu/\phi)^{1/2}(\mu+\phi)^{-1}(\alpha kr)^{-2} \qquad \text{Equation [2]}$$

$$b' = 6.8\times10^{7}\alpha kr \qquad \text{Equation [3]}$$

In this series of equations I is the discharge current measured in amperes, V is the extraction voltage measured in volts, $\phi$ is the work function in eV, A is the total emitting area, $\mu$ is the Fowler-Nordheim term, $\alpha$ is the Nordheim image-correction factor, k is the empirical relation relating tip radius and gap spacing, r is the emitter tip radius in meters, and a and b' are curve fits corresponding to characteristics of the I-V data plotted as $\ln(I/V^2)$ versus 1/V.

When plotted, the graph of $\ln(I/V^2)$ versus 1/V is linear and according to Gomer's derivation has an intercept of ln a and a slope of $b'\phi^{3/2}$. Using Equation 3 and taking $\alpha$ to be 1 and k equal to 5 as instructed by Gomer, the tip radius, r, can be approximated to within 20%. Table 1 shows the estimated magnitude of the tip radius corresponding to each electron discharge I-V curve.

TABLE 1

Estimations of emitter tip radii at various quenching currents using Gomer's Fowler-Nordheim analysis.

| Current at Quench (μA) | Voltage at Quench (kV) | Tip Radius (nm) |
|---|---|---|
| N/A | N/A | 230 |
| 2 | 3.0 | 220 |
| 3 | 3.2 | 102 |
| 25 | 3.2 | 80 |

In conclusion, it was determined that an indium emitter tip can be regenerated as long as there is a sufficient supply of indium metal to form a Taylor cone. Also, the I-V characteristics of the field emitter can be altered depending on which heating and quenching currents are chosen. It was shown that quenching at higher ion emission current produced larger electron emission at lower extraction voltages than when quenched at lower current, implying that the emitter tip radius is reduced when quenching occurs at higher ion emission current.

Thus, the invention provides, among other things, an apparatus and method for regenerating nanotips on a field-emission cathode. Various features and advantages of the invention are set forth in the following claims.

What is claimed is:

1. A method for regenerating a field-emission cathode for an electronic propulsion system, the method comprising:

providing an electric propulsion system including a field-emission cathode, the field-emission cathode comprising an electrode adjacent to an extraction site, wherein the extraction site has a base metal comprising indium associated therewith;

applying a negative bias to the electrode, the negative bias producing a discharge current of greater than 5 μA, wherein the electrode is downstream from the extraction site, to create a Taylor cone having a cone tip in the base metal at the extraction site;

solidifying the base metal to preserve the Taylor cone;

applying a positive bias to the electrode so that the Taylor cone functions as a field-emission cathode; and regenerating the cone tip after it has become damaged by re-liquefying the base metal, applying a negative bias to the electrode to regenerate the Taylor cone tip, and re-solidifying the base metal to preserve the cone tip.

2. The method of claim 1, further comprising providing a heat source associated with the base metal, such that the base metal is re-liquefied by application of heat from the heat source.

3. The method of claim 1, wherein the base metal is selected from the group consisting of indium, a gold-indium alloy, and an indium-bismuth alloy.

4. The method of claim 1, wherein the extraction site is the tip of a single needle emitter.

5. The method of claim 4, wherein the single needle emitter comprises tungsten.

6. The method of claim 1, wherein the extraction site is the opening in a capillary emitter.

7. The method of claim 1, wherein the Taylor cone tip has a radius of about 5 nm to about 200 nanometers.

8. The method of claim 1, wherein during regeneration the Taylor cone becomes an ion emitter that can be used to provide high-Isp and high-efficiency micropropulsion capability to a spacecraft.

9. The method of claim 1, wherein the base metal is indium.

10. A method for regenerating a field-emission cathode for an electronic propulsion system, the method comprising:

providing an electric propulsion system including a field-emission cathode, the field-emission cathode comprising an electrode adjacent to an extraction site, wherein the extraction site has a base metal comprising indium associated therewith;

applying a negative bias to the electrode, wherein the negative bias produces a discharge current of at least 25 μA and wherein the electrode is downstream from the extraction site, to create a Taylor cone having a cone tip in the base metal at the extraction site;

solidifying the base metal to preserve the Taylor cone;

applying a positive bias to the electrode so that the Taylor cone functions as a field-emission cathode; and regenerating the cone tip after it has become damaged by re-liquefying the base metal, applying a negative bias to the electrode to regenerate the Taylor cone tip, and re-solidifying the base metal to preserve the cone tip.

* * * * *